(12) United States Patent
Jamieson et al.

(10) Patent No.: US 6,545,351 B1
(45) Date of Patent: Apr. 8, 2003

(54) UNDERSIDE HEAT SLUG FOR BALL GRID ARRAY PACKAGES

(75) Inventors: Mark P. Jamieson, Folsom; Joseph C. Barrett, El Dorado, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/536,240

(22) Filed: Mar. 27, 2000

Related U.S. Application Data

(63) Continuation of application No. 09/119,863, filed on Jul. 21, 1998, now Pat. No. 6,060,777.

(51) Int. Cl.⁷ .................. H01L 23/495; H01L 23/34; H01L 23/10; B32B 31/00
(52) U.S. Cl. .................. 257/712; 257/737; 257/738; 257/675; 257/676; 257/717; 257/707; 257/713; 257/684; 257/797; 257/796; 257/668; 257/780; 257/782; 257/720; 257/760; 257/718; 361/718; 361/719; 361/720; 361/760
(58) Field of Search .................. 267/717, 707, 267/712, 738, 713, 734, 693, 777–781, 772, 774, 690, 692, 684, 797, 668, 782, 720, 760, 718; 361/718–720, 760

(56) References Cited

U.S. PATENT DOCUMENTS

| | | | |
|---|---|---|---|
| 4,602,314 A | | 7/1986 | Broadbent .................. 361/386 |
| 5,168,926 A | | 12/1992 | Watson .................. 257/706 |
| 5,172,301 A | | 12/1992 | Schneider |
| 5,285,352 A | * | 2/1994 | Pastore et al. .............. 257/712 |
| 5,287,247 A | | 2/1994 | Smits et al. |
| 5,444,602 A | | 8/1995 | Banerjee et al. ............. 257/675 |
| 5,444,909 A | | 8/1995 | Mehr .................. 29/827 |
| 5,450,283 A | * | 9/1995 | Lin et al. .................. 257/706 |
| 5,489,801 A | | 2/1996 | Blish, II .................. 257/675 |

(List continued on next page.)

Primary Examiner—Alexander O. Williams
(74) Attorney, Agent, or Firm—Blakely, Sokoloff, Taylor & Zafman LLP

(57) ABSTRACT

An integrated circuit package which includes an integrated circuit that is attached to a first side of a substrate. The package may also have a solder ball and a heat slug that are both attached to a second side of the substrate. The heat slug and solder ball can be attached to a printed circuit board. The heat slug can provide a thermal path from the substrate to the circuit board which has a relatively wide area. The wide area reduces the thermal impedance and the junction temperatures of the integrated circuit for a given amount of heat.

44 Claims, 1 Drawing Sheet

U.S. PATENT DOCUMENTS

| | | | | |
|---|---|---|---|---|
| 5,530,295 | A | 6/1996 | Mehr | 257/796 |
| 5,557,502 | A | 9/1996 | Banerjee et al. | 257/713 |
| 5,583,377 | A | 12/1996 | Higgins, III | |
| 5,612,576 | A * | 3/1997 | Wilson et al. | 252/788 |
| 5,617,294 | A | 4/1997 | Watson et al. | 361/719 |
| 5,706,178 | A | 1/1998 | Barrow | 361/717 |
| 5,721,454 | A | 2/1998 | Palmer | 257/700 |
| 5,751,063 | A | 5/1998 | Baba | |
| 5,796,589 | A | 8/1998 | Barrow | 257/738 |
| 5,805,419 | A * | 9/1998 | Hundt et al. | 257/720 |
| 5,812,379 | A | 9/1998 | Barrow | 257/778 |
| 5,815,372 | A | 9/1998 | Gallas | 257/781 |
| 5,834,839 | A | 11/1998 | Mertol | |
| 5,851,337 | A * | 12/1998 | Chen | 257/712 |
| 5,856,911 | A * | 1/1999 | Riley | 257/713 |
| 5,883,782 | A | 3/1999 | Thurston | 257/718 |
| 5,894,410 | A | 4/1999 | Barrow | 257/778 |
| 5,895,972 | A | 4/1999 | Paniccia | 257/706 |
| 5,898,219 | A | 4/1999 | Barrow | 257/713 |
| 5,903,436 | A | 5/1999 | Brownell et al. | 257/706 |
| 5,917,702 | A | 6/1999 | Barrow | 257/713 |
| 5,920,117 | A * | 7/1999 | Sono et al. | 275/675 |
| 5,920,120 | A | 7/1999 | Webb et al. | 257/719 |
| 5,923,086 | A | 7/1999 | Winer et al. | 257/714 |
| 5,936,848 | A | 8/1999 | Mehr et al. | 257/698 |
| 5,952,709 | A * | 9/1999 | Kitazawa et al. | 257/758 |
| 5,972,736 | A * | 10/1999 | Malladi et al. | 257/675 |
| 5,990,552 | A | 11/1999 | Xie et al. | 257/718 |
| 5,991,156 | A * | 11/1999 | Bond et al. | 257/713 |
| 6,008,988 | A | 12/1999 | Palmer | 257/713 |
| 6,064,117 | A | 5/2000 | Barrett | 257/738 |
| 6,156,980 | A * | 12/2000 | Peugh et al. | 361/719 |
| 6,194,782 | B1 * | 2/2001 | Katchmar | 257/738 |
| 6,196,002 | B1 * | 3/2001 | Newman et al. | 361/719 |
| 6,242,075 | B1 * | 6/2001 | Chao et al. | 257/714 |

* cited by examiner

UNDERSIDE HEAT SLUG FOR BALL GRID ARRAY PACKAGES

CROSS REFERENCE TO RELATED APPLICATION

This application is a continuation of application Ser. No. 09/119,863, filed Jul. 21, 1998 now U.S. Pat. No. 6,060,777.

BACKGROUND OF THE INVENTION

1. Field of the Invention

The present invention relates to an integrated circuit package.

2. Background Information

Integrated circuits are typically assembled into a package that is mounted to a printed circuit board. FIG. 1 shows an integrated circuit package commonly referred to as a plastic ball grid array (PBGA) package. The PBGA package includes an integrated circuit 1 that is mounted to a substrate 2. Bond wires 3 may connect the integrated circuit 1 to a top surface of the substrate 2. The integrated circuit 1 and bond wires 3 may be enclosed by an encapsulant 4.

The package has a plurality of solder balls 5 that are attached to a bottom surface of the substrate 2. The substrate 2 is typically a printed circuit board which has routing traces, vias, etc. which electrically connect the integrated circuit 1 to the external solder balls 5. The solder balls 5 are reflowed to attach the package to a printed circuit board 6.

The integrated circuit 1 generates heat which must be removed from the package. Some integrated circuit packages incorporate heat slugs, heat sinks and other thermal elements which are attached to the top surface of the package. The additional thermal elements can add to the complexity and cost of mass producing the package.

A portion of the heat generated by the integrated circuit 1 may flow into the printed circuit board 6 through the solder balls 5. The thermal impedance through the solder balls 5 is inversely proportional to the area of the balls 5. The solder balls 5 have a relatively small cross-sectional area. The relatively small solder ball area therefore creates a relatively high thermal impedance. The junction temperatures of the integrated circuit are proportional to the thermal impedance of the balls. A higher impedance increases the junction temperatures for a given amount of heat. It would be desirable to provide a PBGA package that more efficiently transfers heat into the printed circuit board than packages of the prior art.

SUMMARY OF THE INVENTION

One embodiment of the present invention is an integrated circuit package which includes an integrated circuit that is attached to a first side of a substrate. The package may also have a solder ball and a heat slug that are both attached to a second side of the substrate.

DETAILED DESCRIPTION OF THE INVENTION

One embodiment of the present invention is an integrated circuit package which includes an integrated circuit that is attached to a first side of a substrate. The package may also have a solder ball and a heat slug that are both attached to a second side of the substrate. The heat slug and solder ball can be attached to a printed circuit board. The heat slug can provide a thermal path from the substrate to the circuit board which has a relatively wide area. The wide area reduces the thermal impedance and the junction temperatures of the integrated circuit for a given amount of heat.

Figure 1:
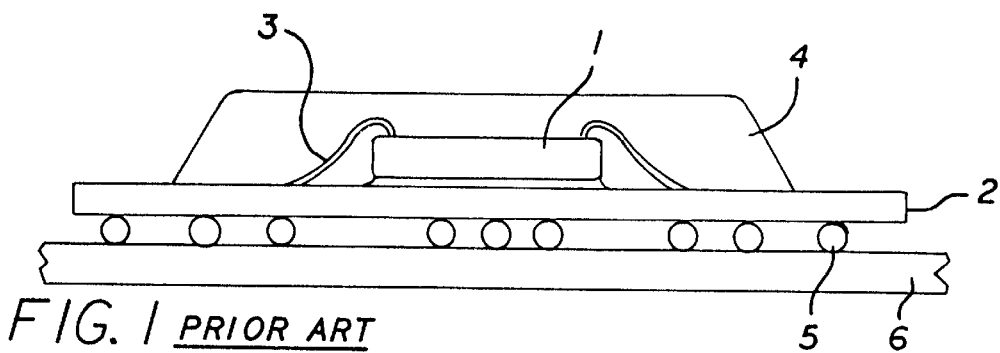
FIG. 1 is a side sectional view of an integrated circuit package of the prior art.
Figure 2:
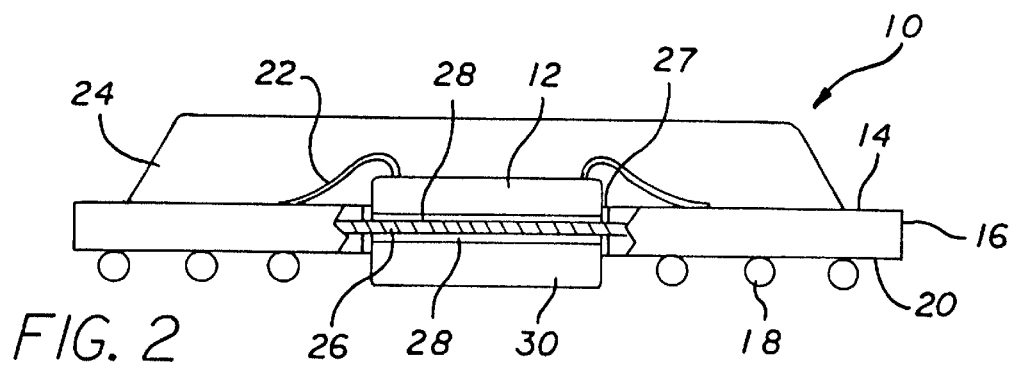
FIG. 2 is a side sectional view showing an embodiment of an integrated circuit package of the present invention.

Referring to the drawings more particularly by reference numbers, FIG. 2 shows an embodiment of an integrated circuit package 10 of the present invention. The package 10 may include an integrated circuit 12 that is attached to a first side 14 of a substrate 16. The package 10 may also have a plurality of solder balls 18 that are attached to a second side 20 of the substrate 16.

The substrate 16 may be a printed circuit board which is constructed from layers of dielectric and conductive material. The conductive material may be copper which is formed into patterns. The copper patterns may include surface pads and routing traces (not shown) on the first 14 and second 20 sides of the substrate 16. The solder balls 18 may be attached to surface pads on the second side 20. The surface pads on the first side 14 may be connected to the integrated circuit 12 by a plurality of bond wires 22. The bond wires 22 and integrated circuit 12 may be enclosed by a protective encapsulant 24. Vias (not shown) may be formed in the substrate 16 to electrically connect the integrated circuit 12 to the solder balls 18.

The substrate 16 may have an exposed conductive layer 26 that extends across a center opening 27 in the dielectric layers of the substrate 16. The conductive layer 26 may be exposed by cutting openings in the dielectric before lamination or etching the dielectric after lamination of the substrate 16. The integrated circuit 12 may be mounted to the exposed conductive layer 26 by a thermally conductive epoxy 28.

A first heat slug 30 may be attached to the second side 20 of the substrate 16. The heat slug 30 can be attached directly to the exposed conductive layer 26 of the substrate 16 by a thermally conductive epoxy 28. The heat slug 30 may be a strip of thermally conductive material such as aluminum or copper.

Figure 3:
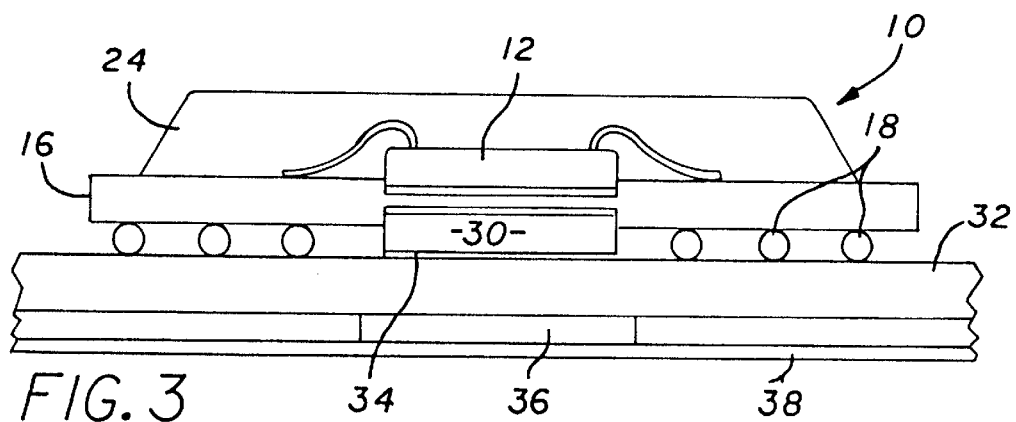
FIG. 3 is a side sectional view showing the integrated circuit package within an electronic assembly.

FIG. 3 shows the package 10 mounted to a printed circuit board 32. By way of example, the printed circuit board 32 may be a motherboard of a computer system. The solder balls 18 are reflowed onto corresponding conductive surface pads (not shown) of the circuit board 32. The first heat slug 30 may be attached to the printed circuit board 32 by a solder or an adhesive material. Alternatively, the heat slug 30 may be pressed into the circuit board 32 by the interconnection of the solder balls 18 and the board 32.

The heat slug 30 provides a direct thermal path from the integrated circuit 12 to the printed circuit board 32. The thickness of the heat slug 30 should be controlled to insure that the solder balls 18 will become attached to the printed circuit board 32 in an embodiment where the solder is reflowed. A thermal grease 34 may be located between the heat slug 30 and the circuit board 32 when the slug 30 is not attached to the board 32. The thermal grease 34 can provide a thermal path into the circuit board 32 while compensating for tolerances in the height of the electronic assembly.

A second heat slug 36 may be attached to the printed circuit board 32. Although not shown, the second heat slug 36 may extend through an opening in the circuit board 32 and be directly coupled to the first heat slug 30. The second heat slug 36 may be coupled to the chassis 38 of a computer.

The first 30 and second 36 heat slugs can thus provide a direct thermal path from the integrated circuit 12 to the computer chassis 38.

Figure 4:
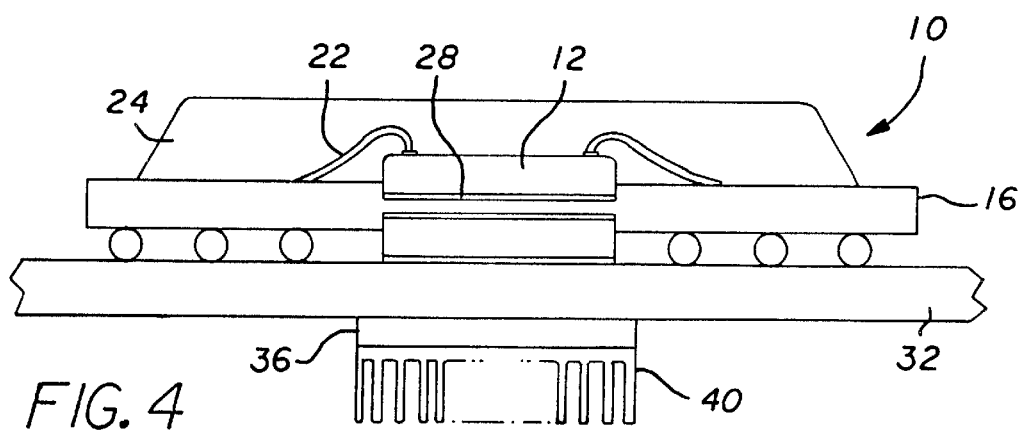
FIG. 4 is a side sectional view showing the integrated circuit package within an alternate electronic assembly.

FIG. 4 shows an alternate embodiment, wherein a heat sink 40 is attached to the second heat slug 36. The heat sink 40 may be in the flow path of a fan which removes the heat generated by the integrated circuit 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, the first heat slug 30 may be attached directly to the bottom surface of the integrated circuit 12. Alternatively, the substrate 16 may not have openings in the dielectric, wherein the integrated circuit 12 is mounted to a dielectric surface on the first side 14 of the substrate 16 and the heat slug 30 is mounted to a dielectric surface on the second side 20 of the substrate 16.

What is claimed is:

1. An integrated circuit package, comprising:
   a substrate which has a first side and a second side and an exposed conductive layer;
   an integrated circuit attached to said first side of said substrate and thermally coupled to said exposed conductive layer;
   a solder ball attached to said second side of said substrate; and,
   a heat slug with a first end attached to said second side of said substrate and thermally coupled to said exposed conductive layer, an opposite second end of the heat slug extending beyond the second side of said substrate, the heat slug to provide a thermally conductive path to cool said integrated circuit attached to said first side of said substrate.

2. The package as recited in claim 1, wherein the second end of the heat slug is substantially coplanar with the unattached end of the solder ball.

3. The package as recited in claim 1, further comprising a bond wire that is attached to said integrated circuit and said substrate.

4. The package as recited in claim 1, further comprising an encapsulant that encapsulates said integrated circuit.

5. The package as recited in claim 1, wherein the second end of said heat slug to provide a thermally conductive path to a circuit board on which the solder ball of the integrated circuit package is coupled.

6. The package as recited in claim 5, wherein the second end of the heat slug to couple to a heat dissipating surface of a circuit board on which the integrated circuit package is mounted.

7. The package as recited in claim 1, wherein, said heat slug is aluminum.

8. The package as recited in claim 1, wherein, said heat slug is copper.

9. The package as recited in claim 1, further comprising a printed circuit board coupled to said solder ball and thermally coupled to said heat slug.

10. The package as recited in claim 9, wherein, said printed circuit board is thermally coupled to said heat slug by a thermal grease.

11. An integrated circuit package, comprising:
    a substrate which has a first side and a second side and an exposed conductive layer exposed by a top central opening in a dielectric layer and a bottom central opening in said dielectric layer;
    an integrated circuit attached to said first side of said substrate and thermally coupled to said exposed conductive layer through said top central opening in said dielectric layer;
    a solder ball attached to said second side of said substrate; and,
    a heat slug with a first end attached to said second side of said substrate and thermally coupled to said exposed conductive layer through said bottom central opening in said dielectric layer, an opposite second end of the heat slug extending beyond second side of the substrate, the heat slug to provide a thermal path to cool said integrated circuit attached to said first side of said substrate.

12. The package as recited in claim 11, wherein the second end of the heat slug is substantially coplanar with the unattached end of the solder ball.

13. The package as recited in claim 11, further comprising a bond wire that is attached to said integrated circuit and said substrate.

14. The package as recited in claim 11, further comprising an encapsulant that encapsulates said integrated circuit.

15. The package as recited in claim 11, wherein, said heat slug is attached and thermally coupled to said exposed conductive layer of said substrate by a thermal conductive epoxy.

16. The package as recited in claim 11, wherein, said integrated circuit is attached and thermally coupled to said exposed conductive layer of said substrate by a thermal conductive epoxy.

17. The package as recited in claim 11, wherein, said heat slug is aluminum.

18. The package as recited in claim 11, wherein, said heat slug is copper.

19. The package as recited in claim 11, further comprising a printed circuit board coupled to said solder ball and thermally coupled to said heat slug.

20. The package as recited in claim 19, wherein, said printed circuit board is thermally coupled to said heat slug by a thermal grease.

21. A method of cooling an integrated circuit, the method comprising:
    providing an integrated circuit package having a first substrate with a top side, a bottom side, and an exposed conductive layer exposed through the top side and the bottom side with an integrated circuit thermally coupled to the exposed conductive layer at the top side;
    conducting heat from the integrated circuit into the exposed conductive layer of the first substrate at the top side;
    conducting heat from the exposed conductive layer of the first substrate at the bottom side into the top surface of a first heat slug thermally coupled thereto; and
    conducting heat from the top surface to the bottom surface of the first heat slug and into a thermally conductive second substrate, the bottom surface of the first heat slug extending beyond the bottom side of the first substrate.

22. The method of claim 21, wherein the second substrate is a printed circuit board thermally coupled to the bottom surface of the first heat slug.

23. The method of claim 22, wherein, the printed circuit board has a wide area to reduce the thermal impedance and the junction temperatures of the integrated circuit.

24. The method of claim 22, further comprising:

conducting heat from the printed circuit board into a heat sink thermally coupled to the printed circuit board.

25. The method of claim 24, further comprising:

fanning air over the heat sink to conduct heat into the air from the heat sink.

26. The method of claim 21, wherein the second substrate is a heat sink thermally coupled to the first heat slug.

27. The method of claim 26, further comprising:

fanning air over the heat sink to conduct heat into the air from the heat sink.

28. The method of claim 21, wherein the second substrate is a second heat slug thermally coupled to the first heat slug.

29. The method of claim 28, further comprising:

conducting heat from the second heat slug into a heat sink thermally coupled to the second heat slug.

30. The method of claim 29, further comprising:

fanning air over the heat sink to conduct heat into the air from the heat sink.

31. The method of claim 28, further comprising:

conducting heat from the second heat slug into a printed circuit board coupled to the second heat slug, the printed circuit board thermally coupled to the second heat slug.

32. The method of claim 31, wherein, the printed circuit board has a wide area to reduce the thermal impedance and the junction temperatures of the integrated circuit.

33. The method of claim 31, further comprising:

conducting heat from the printed circuit board into a heat sink thermally coupled to the printed circuit board.

34. The method of claim 33, further comprising:

fanning air over the heat sink to conduct heat into the air from the heat sink.

35. A method of assembling an integrated circuit package, comprising:

providing a substrate having a top side, a bottom side and a conductive layer, the conductive layer having an exposed portion of a first side exposed through the top side of the substrate and an exposed portion of a second side exposed through the bottom side of the substrate;

thermally coupling an integrated circuit to the exposed portion of the first side of the conductive layer;

attaching a solder ball to a solder pad on the bottom side of the substrate; and thermally coupling the top surface of a first heat slug to the exposed portion of the second side of the conductive layer, the bottom surface of the first heat slug extending beyond the bottom side of the substrate.

36. The method as recited in claim 35, further comprising:

attaching the solder ball to a printed circuit board.

37. The method as recited in claim 36, further comprising:

attaching the first heat slug to the printed circuit board where the bottom surface of the first heat slug is substantially coplanar with the end of the solder ball attached to the printed circuit board.

38. The method as recited in claim 35, further comprising:

encapsulating the integrated circuit.

39. The method as recited in claim 35, further comprising:

bonding wires between the integrated circuit and the substrate.

40. The method as recited in claim 36, further comprising:

attaching a second heat slug to the first heat slug and to the printed circuit board.

41. The method as recited in claim 40, further comprising:

attaching a heat sink to the printed circuit board.

42. The method as recited in claim 36, further comprising:

attaching a second heat slug to the first heat slug.

43. The method as recited in claim 42 further comprising:

attaching a heat sink to the second heat slug.

44. The method as recited in claim 35, wherein, the providing of the substrate includes, forming an opening in the top side of the substrate to expose the exposed portion of the first side of the conductive layer, and forming an opening in the bottom side of the substrate to expose the exposed portion of the second side of the conductive layer.

* * * * *